United States Patent [19]

Smith

[11] Patent Number: 4,507,848

[45] Date of Patent: Apr. 2, 1985

[54] CONTROL OF SUBSTRATE INJECTION IN LATERAL BIPOLAR TRANSISTORS

[75] Inventor: Peter R. Smith, San Jose, Calif.

[73] Assignee: Fairchild Camera & Instrument Corporation, Mountain View, Calif.

[21] Appl. No.: 443,846

[22] Filed: Nov. 22, 1982

[51] Int. Cl.³ .................... H01L 21/265; H01L 21/74
[52] U.S. Cl. .............................. 29/576 B; 29/576 E; 29/576 W; 29/577 C; 29/578; 148/1.5; 148/175; 148/187; 357/35; 357/44; 357/46; 357/89; 357/50; 357/91; 357/92
[58] Field of Search ............ 29/576 B, 576 E, 576 W, 29/577 C, 578; 148/1.5, 175, 187; 357/35, 44, 46, 89, 91, 92, 49, 50

[56] References Cited

U.S. PATENT DOCUMENTS

| | | | |
|---|---|---|---|
| 3,383,567 | 5/1968 | King et al. | 148/1.5 |
| 3,648,125 | 3/1972 | Peltzer | 148/175 X |
| 4,025,364 | 5/1977 | Smith | 148/1.5 |
| 4,045,251 | 8/1977 | Graul et al. | 148/1.5 |
| 4,082,571 | 4/1978 | Graul et al. | 148/1.5 |
| 4,144,098 | 3/1979 | Roesner | 148/1.5 |
| 4,167,425 | 9/1979 | Herbst | 148/187 X |
| 4,199,378 | 4/1980 | van Gils | 357/44 X |
| 4,231,057 | 10/1980 | Momma et al. | 357/50 |
| 4,259,680 | 3/1981 | Lepselter et al. | 357/35 |
| 4,320,411 | 3/1982 | Fukushima | 357/35 |
| 4,398,338 | 8/1983 | Tickle et al. | 29/571 |
| 4,433,471 | 2/1984 | Ko et al. | 29/578 |

Primary Examiner—William G. Saba
Attorney, Agent, or Firm—Kenneth Olsen; Carl Silverman; William H. Murray

[57] ABSTRACT

A method for fabricating a semiconductor structure which reduces substrate current injection from lateral bipolar transistors. A buried layer of a first conductivity type is formed in a semiconductor substrate of opposite conductivity. An epitaxial layer of the first conductivity type is formed such that at least a portion of the epitaxial layer overlies the buried layer. Isolation oxide regions are formed in a epitaxial layer. The isolation oxide regions extend to the substrate to define an island of electrically isolated epitaxial material. A selected impurity of the first conductivity type is introduced into that portion of the epitaxial layer beneath the to-be-formed lateral transistor. The lateral transistor is formed in the epitaxial layer.

9 Claims, 9 Drawing Figures

CONTROL OF SUBSTRATE INJECTION IN LATERAL BIPOLAR TRANSISTORS

BACKGROUND OF THE INVENTION

1. Field of the Invention

This invention relates to semiconductor integrated circuits and, in particular, to a technique for controlling substrate current injection in lateral bipolar transistors.

2. Discussion of the Prior Art

It has long been recognized that whenever a lateral transistor is used in a bipolar chip, there arises a parasitic vertical transistor which injects current into the substrate.

To date, efforts to minimize this parasitic current loss have been limited to introducing as much dopant as possible into the buried layer. This method is limited in its usefulness by at least two factors. First, the buried layer lateral diffusion is restricted by the distance between adjoining isolated buried layers. That is, the maximum number of buried layers which may be placed in any area is limited by the size of the buried layers to be so placed. The size of any buried layer, in each lateral direction, is equal to the width of the opening in the buried layer oxide (the buried layer masking window) plus the distance that the buried layer doping impurity diffuses laterally from the edge of the opening in the buried layer oxide (buried layer lateral diffusion). Second, the effectiveness of the impurity concentration in the buried layer in reducing any minority carrier currents from being injected through it and into the substrate is dependent upon the alignment between the buried layer and the epitaxial island which forms the body of the active region above the buried layer. That is, the buried layer is positioned under the active base and emitter regions of the epitaxial regions by the alignment of the so-called Isolation Mask to the so-called Buried Layer Mask. The reproducibility with which this alignment can be made is one of the limiting factors affecting the effectiveness of the buried layer in reducing the minority carrier currents collected by the reverse biased substrate.

This is due to the relationship between base current and the collector current in a bipolar transistor. The model first proposed by Schockley states that the ratio of the collector current (current into the substrate in this case) and the base current (majority current removed ohmically from the buried layer) is inversely proportional to the amount of buried layer impurity placed between the forward biased emitter-base (P-Emitter to N-Base/Buried Layer) junction and the reversed biased base-collector (N-Base/Buried Layer to P-Collector/Substrate) junction.

U.S. patent application Ser. No. 219,784, entitled "Ion Implanted Memory Cells For High Density RAM", inventors Ko et al., filed Jan. 18, 1982 and assigned to the assignee of the present invention, discloses a process wherein lateral PNP transistors are formed as part of high density random access memory (RAM) cells. While the process disclosed therein represents a significant improvement in packing density and yield over the prior art, and thereby makes possible the fabrication of bipolar memory cells in accordance with very large scale integration (VLSI) packing densities, it retains the basic substrate injection deficiency discussed above.

In prior art bipolar RAM cells fabricated in integrated injection logic (I$^2$L) technology, such as the cells disclosed in the above-referenced application, when either or both of the P-emitter and the P-collector of the lateral PNP transistor are forward biased, they inject current, generally, in two directions. One direction is the proper direction, that is, from P-emitter to P-collector or, when the PNP transistor is saturated, from P-collector to P-emitter. The other, undesirable current path is from the P-emitter into the substrate. Typically, the injection current into the substrate is several times larger than the current in the desired, lateral direction.

As stated above, in the past, a solution to the problem of substrate current injection has been to increase the doping in the buried layer. Referring to FIG. 1, which illustrates a cross-section of a high-density RAM cell fabricated according to the process of the above-referenced application, the buried layer of the cell, if properly formed, extends between the isolation oxide regions surrounding the cell. Thus, increased doping in the buried layer is usually sufficient to arrest substrate current injection from the emitter of the lateral PNP transistor to a reasonable level. However, particularly with denser RAM cells, because of the small mask dimensions and the difficulty in obtaining precise registration between the Buried Layer mask and the Isolation mask, the buried layer frequently does not span the distance between isolation oxide regions. That is, as illustrated in FIG. 2, it often occurs that gaps g, exist between the edges of the buried layer and the isolation oxide. When this occurs, increased doping in the buried layer is not effective in preventing substrate injection because the substrate is not properly sealed off.

SUMMARY OF THE INVENTION

Thus, it is an object of the present invention to provide a method for forming a lateral PNP transistor wherein vertical current injection is minimized.

According to the method of the present invention, a buried layer of a first conductivity type is formed over a selected region of a semiconductor substrate of a second conductivity type, the second conductivity type being opposite the first conductivity type. Next, an epitaxial layer of the first conductivity type is formed on the substrate such that at least a portion of the epitaxial layer overlies the buried layer. Isolation oxide regions are then formed in the epitaxial layer to define an electrically isolated island of epitaxial material. Next, a selected impurity of the first conductivity type is introduced into that portion of the epitaxial layer beneath a to-be-formed lateral bipolar transistor. Finally, the lateral bipolar transistor is formed in the epitaxial layer.

The method of the present invention produces several major advantages over the prior art. First, the implant which reduces vertical current injection is self-aligned. In the case of a discrete lateral transistor, the implant could be made entirely self-aligning since the device is controlled on four sides by the isolation oxide. In the case of a merged device, the position of the implant with respect to the active region and the buried layer is controlled by the isolation oxide on three sides and by a mask on the fourth edge which bounds the NPN and PNP portions of the device. The term "sink implant" will be used hereinafter to refer to an implant of impurity of the first conductivity type used to increase the amount of impurity of the first conductivity type between the emitter of the second conductivity type and the substrate of the second conductivity type. The term has been used in the past, with respect to other fabrication processes, to describe an implant of impurity of the first conductivity type to ohmicly connect the surface of the device to the buried layer.

Second, as further described below, a lower sink implant dose is required. This feature reduces the amount of crystal strain introduced by the implant. Introduction of impurities into a crystal lattice deforms the lattice. One reason for the deformation is that the impurity has a different ionic radius (and hence volume) than the ionic radius of the host crystal and hence the impurity atom does not "fit" substitutionaly into the crystal lattice without some local stretching of the lattice about the site of the impurity atom. Another reason is that introduction of too many impurity atoms of any size into a crystal will tend to distort the crystal lattice. The result of either of these conditions will be to alter the periodicity of the crystal lattice. This alteration is referred to as "crystal strain". In extreme cases this alteration leads to the destruction of the crystal properties in the neighborhood of the introduced impurities. This in turn destroys the semiconductor properties of the crystal in this neighborhood. The reduced amount of impurity required by this invention to form the "sink implant" will reduce the crystal strain associated with the second mechanism just described.

Third, the method of the present invention places the sink implant deep in the device under the injecting P regions. This increases the amount of "base Q" between the P-injectors and the substrate which reduces the substrate current while keeping to a minimum the amount of base Q between the P-emitter and the P-collector thereby keeping the lateral collector current as large as possible.

THE DETAILED DESCRIPTION OF A PREFERRED EMBODIMENT

An embodiment of the method of this invention as applied in I²L technology will now be described in detail. It should be understood, however, that this description is for the purpose of illustration and not of limitation and that other embodiments of this invention on other semiconductor device technologies will be obvious to those skilled in the art in view of this description. For example, the process of the present invention can also be used to advantage in the fabrication of discrete bipolar transistors.

Figure 1:
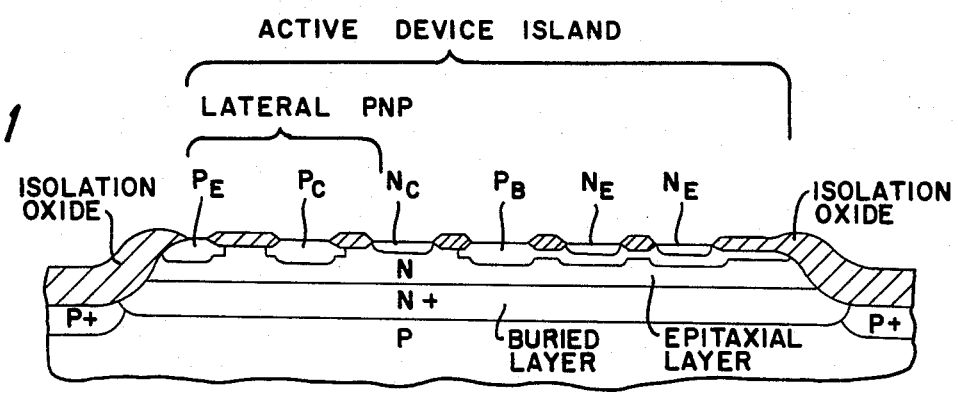
FIG. 1 is a cross-section of a high-density RAM cell structure fabricated in accordance with a prior art technique.
Figure 2:
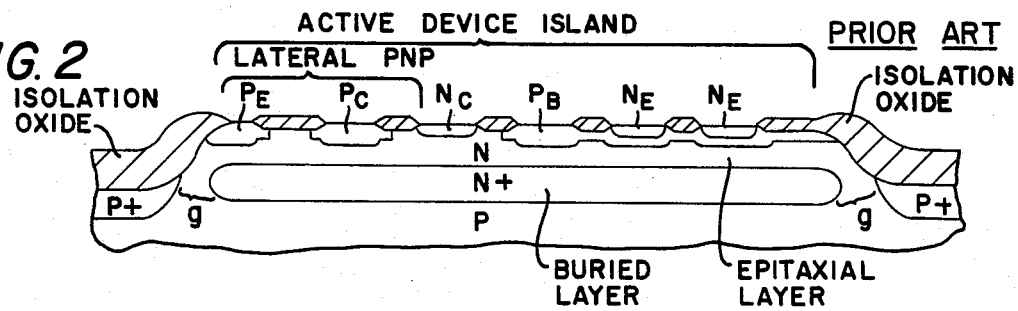
FIG. 2 is a cross-section of a prior art high density RAM cell structure depicting gaps between a buried layer and isolation oxide regions.
Figure 3:
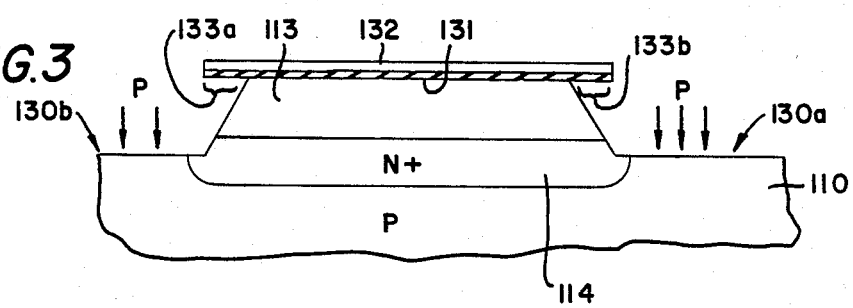
FIGS. 3 through 6 depict cross-sections of a semiconductor structure fabricated in accordance with the method of the present invention.
Figure 4:
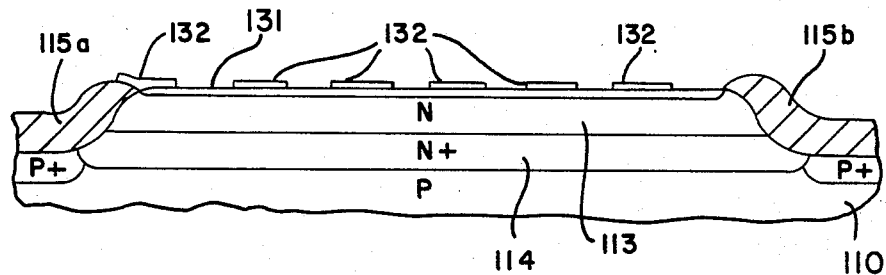

Turning to FIGS. 3 and 4 of the drawings, according to a preferred embodiment of the present invention, a P-type silicon substrate 110 having a [100] crystal orientation is oxidized, patterned with a buried layer mask and then diffused with an N-type impurity to form a buried layer 114 of N+ conductivity. The buried layer 114 provides for low resistance interconnection to the collector regions of a to-be-formed NPN transistor and to the base region of a to-be-formed PNP transistor of an I²L memory cell.

A thin epitaxial layer 113, approximately 1–1.5 microns thick, is then grown on the substrate 110 such that at least a portion of the epitaxial layer 113 overlies the buried layer 114. This step is followed by the growth of a thin layer of thermal oxide 131, about 200–300 Angstroms thick, and the deposition of a layer of silicon nitride 132, about 1000–1500 Angstroms thick, from the decomposition of silane and ammonia.

The nitride, oxide and underlying silicon are then selectively etched to form isolation grooves, illustrated as grooves 130a, 130b in FIG. 3, to define islands of epitaxial silicon material in which active memory cell devices are to be formed. Portions of the structure which are not to be etched are protected by isolation masks. The etching conditions are adjusted to produce an overhang 133a, 133b of the dielectric layer to mask implanted ions during a subsequent field implantation. For example, the etching conditions are adjusted by the use of a buffered HF etch to remove exposed portions of oxide 131 as well as to undercut oxide 131 beneath the edge of the remaining nitride 132, prior to the etching of epitaxial layer 113 with a well-known silicon etch. A P-type dopant, such as boron implanted at about 45 KeV to a dosage of $1-2\times 10^{14}$ cm$^{-2}$, is then implanted into the field to serve as a channel stopper in a well-known manner.

The field region is then oxidized in a well-known manner to form isolation oxide 115a, 115b in grooves 130a and 130b, as shown in FIG. 4. A self-aligned transistor mask is then applied to define the various components of the memory cell, that is, the lateral PNP transistor and the vertical NPN transistors, by selectively removing portions of the nitride layer 132.

Figure 5:
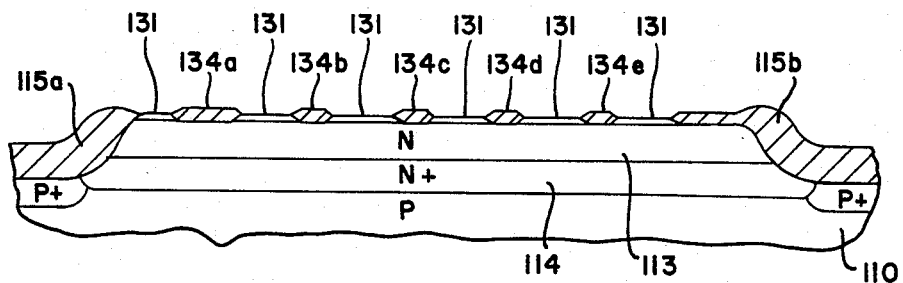

The exposed areas of oxide layer 131 are then oxidized to a greater thickness of about 1500–2000 Angstoms to form the self-aligned transistor oxide regions 134a–134e. The nitride layer is then removed leaving portions of the thin 200–300 Angstrom oxide layer 131 formally under the nitride 132 and also leaving the thicker regions of masking oxide 134a–134e. The resulting structure is shown in FIG. 5.

Figure 6:
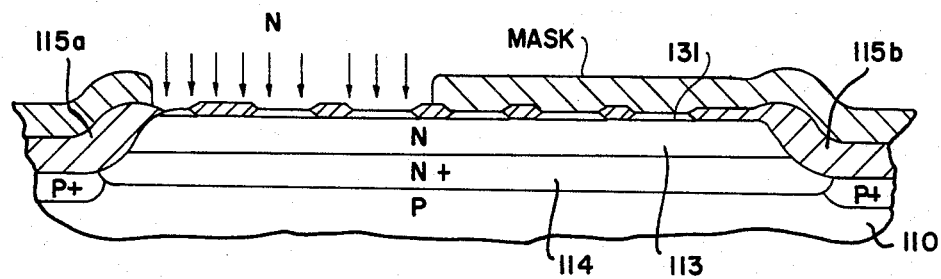

According to the present invention and as shown in FIG. 6, at this stage of the fabrication process, a sink mask is formed over the wafer such that the entire portion of the active island which will contain the to-be-formed lateral PNP transistor is exposed. An N-type dopant, preferably phosphorous implanted at about 380 KeV (P++ at 190 KeV) to a dose of about $5\times 10^{13}$ cm$^{-2}$, is then implanted into the exposed portions of the expitaxial layer.

Figure 7:
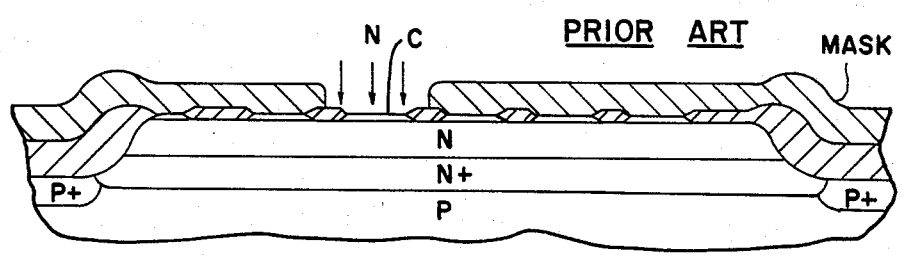
FIG. 7 depicts a cross-section of a semiconductor structure made in accordance with a prior art technique wherein a N-type implant is confined to a collector region C.

Introducing the N-type implant to the entire region of the lateral PNP transistor as just described is in contrast to the prior art technique, shown in FIG. 7, wherein the N-type implant is confined to the collector region C.

Figure 8:
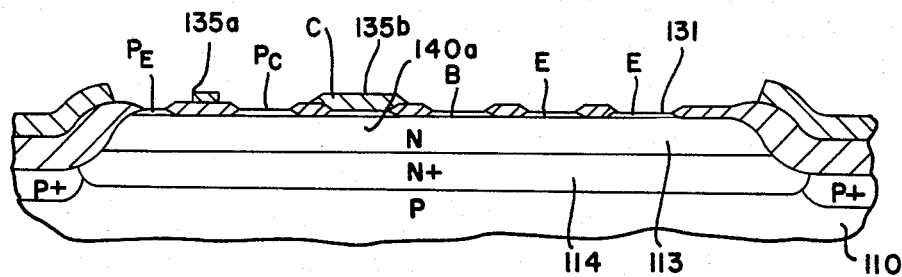
FIGS. 8 and 9 depict cross-sections of a semiconductor structure fabricated in accordance with the method of the present invention.

Next, as shown in FIG. 8, a photoresist implant mask 135a, 135b (also called a "base exclusion mask") is applied to protect the base and base contact of the lateral PNP transistor from implantation with a P-type impurity such as boron. The base contact of the lateral PNP is also the contact to the collector of the vertical NPN. P-type impurity, typically boron ions, are then implanted into the lateral PNP emitter and collector windows, labeled $P_E$ and $P_C$, respectively, and the NPN base contact window B, the bypass resistors which are formed within the epitaxial region 113 surrounding the to-be-formed sink contact region 140a and the NPN emitter windows E. Boron ions are also im planted through a self-aligned transistor oxide to form the interconnecting inactive base regions and self-aligned resistors. A two-energy boron implantation is used to yield a shallow implant which provides good ohmic contact to the to-be-formed metal contact areas and a deep implant to provide current gain control for the base of the NPN transistor. The shallow implant uses B+ at 30 to 50 KeV with a dose of 1 to $2 \times 10^{14}$ cm$^{-2}$ and a deep implant uses B+ at 80 to 150 KeV with a dose of 0.8 to $2.0 \times 10^{13}$ cm$^{-2}$. Preferred energies and doses for the shallow implant B+ at 50 KeV and $1 \times 10^{14}$ cm$^{-2}$ and for the deep implant B+ at 120 KeV and $1.5 \times 10^{13}$ cm$^{-2}$.

Figure 9:
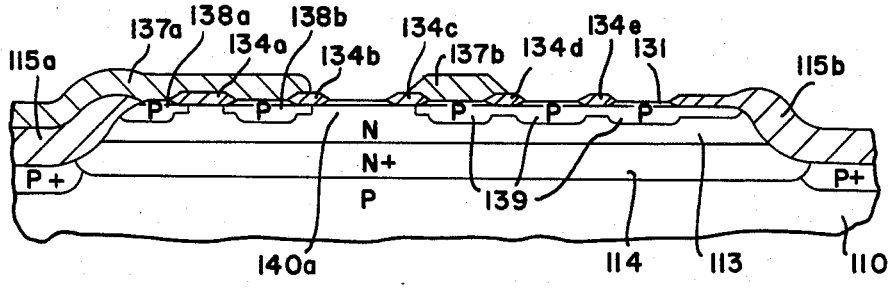

Following removal of photoresist mask 135a, 135b, an arsenic implant photoresist mask 137a, 137b, as shown in FIG. 9, is applied to protect, in conjunction with the self-aligned transistor oxide regions 134a–134e, and field oxide 115a, b the surface of the structure everywhere except for the collector sink contact window C and the vertical NPN transistor emitter windows E. The arsenic implant mask 137a, 137b is stripped after arsenic implantation using As+ at 40 to 120 KeV at 0.5 to $2.0 \times 10^{16}$ cm$^{-2}$ with 80 KeV and $1 \times 10^{16}$ cm$^{-2}$ preferred. A single heat cycle at 1000° C. for about 20–80 minutes in nitrogen is then employed to anneal and drive in the implanted dopant. Contact windows are then opened by appropriate etching of the thin oxide layer 131 formed on the epitaxial layer 113. In one embodiment, these contact windows are opened by dipping the wafer into an etch, such as buffered HF, for a time sufficient to remove oxide 131 but not sufficient to substantially change thicker oxide 134a–134e. Thus, no contact mask is required. The substrate is then ready for metal evaporation for the formation of topside electrical interconnects.

I claim:

1. A method for fabricating a semiconductor structure which reduces vertical current injection from lateral bipolar transistors formed in said structure, said method comprising:
    (a) forming a buried layer of a first conductivity type in a selected region of a semiconductor substrate of a second conductivity type, the second conductivity type being opposite the first conductivity type,
    (b) forming an epitaxial layer of the first conductivity type such that at least a portion of the epitaxial layer overlies the buried layer,
    (c) forming isolation oxide regions in said epitaxial layer which regions extend to the substrate to define an electrically isolated island of epitaxial material,
    (d) introducing a selected impurity of the first conductivity type into substantially the entire portion of the epitaxial layer beneath a to-be-formed lateral bipolar transistor, and
    (e) forming the lateral bipolar transistor in the epitaxial layer.

2. The method of claim 1 wherein the lateral bipolar transistor is a discrete device.

3. The method of claim 1 wherein the lateral bipolar transistor is a PNP transistor.

4. The method of claim 3 wherein the selected impurity is phosphorous.

5. The method of claim 4 wherein the phosphorous is implanted at about 380 KeV to a dose of about $5 \times 10^{13}$ cm$^{-2}$.

6. A method for fabricating a semiconductor structure which reduces vertical current injection from a lateral bipolar transistor formed as part of a merged device in said structure, said method comprising:
    (a) forming a buried layer of a first conductivity type over a selected region of a semiconductor substrate of a second conductivity type, the second conductivity type being opposite the first conductivity type,
    (b) forming an epitaxial layer of the first conductivity type such that at least a portion of the epitaxial layer overlies the buried layer,
    (c) forming oxide isolation regions in said epitaxial layer which regions extend to the substrate to define an electrically isolated island of epitaxial material,
    (d) forming a mask over the surface of the semiconductor structure, the mask being patterned to expose that portion of the epitaxial layer wherein the lateral bipolar transistor of the merged device will be formed,
    (e) introducing a selected impurity of the first conductivity type into substantially the entire portion of the epitaxial layer beneath the to-be-formed lateral bipolar transistor, and
    (f) forming the merged device in the epitaxial layer.

7. The method of claim 6 wherein the merged device comprises a lateral PNP transistor and a vertical NPN transistor.

8. The method of claim 7 wherein the selected impurity is phosphorous.

9. The method of claim 8 wherein the phosphorous is implanted at about 380 KeV to a dose of about $5 \times 10^{13}$ cm$^{-2}$.

* * * * *